(12) United States Patent
Danello et al.

(10) Patent No.: US 6,615,997 B2
(45) Date of Patent: Sep. 9, 2003

(54) WEDGELOCK SYSTEM

(75) Inventors: Paul A. Danello, Franklin, MA (US); Joseph A. Mirabile, Medford, MA (US); Anthony Carrara, Holliston, MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 10/071,710

(22) Filed: Feb. 7, 2002

(65) Prior Publication Data

US 2003/0146176 A1 Aug. 7, 2003

(51) Int. Cl.⁷ .................................................. A47F 7/00
(52) U.S. Cl. ...................................................... 211/126
(58) Field of Search ............................... 211/26, 41.17, 211/41.14, 41.4; 361/386

(56) References Cited

U.S. PATENT DOCUMENTS

| | | | |
|---|---|---|---|
| 3,971,186 A | | 7/1976 | Havelka et al. ............. 52/753 G |
| 4,732,281 A | * | 3/1988 | Hall et al. ...................... 211/26 |
| 4,775,260 A | | 10/1988 | Kecmer .................... 403/409.1 |
| 4,824,303 A | | 4/1989 | Dinger ........................... 411/79 |
| 4,879,634 A | | 11/1989 | Storrow et al. .............. 361/388 |
| 4,909,752 A | | 3/1990 | Hallum et al. ............... 439/325 |
| 5,010,444 A | | 4/1991 | Storrow et al. .............. 361/386 |
| 5,019,939 A | * | 5/1991 | Reimer ......................... 361/721 |
| 5,071,013 A | * | 12/1991 | Peterson ........................ 211/26 |
| 5,172,306 A | * | 12/1992 | Cantrell ....................... 361/802 |
| 5,211,496 A | | 5/1993 | Hurowitz ....................... 403/24 |
| 5,225,964 A | | 7/1993 | Nemes ......................... 361/386 |
| 5,251,099 A | | 10/1993 | Goss et al. .................. 361/721 |
| 5,321,888 A | | 6/1994 | Nemes ................... 29/890.054 |
| 5,607,273 A | | 3/1997 | Kecmer et al. ................ 411/79 |
| 5,626,406 A | * | 5/1997 | Schmid ................. 312/334.28 |
| 5,779,388 A | | 7/1998 | Yamamoto ................ 403/405.1 |
| 5,859,764 A | | 1/1999 | Davis et al. ................. 361/704 |
| 6,064,575 A | | 5/2000 | Urda et al. .................. 361/721 |
| 6,104,613 A | | 8/2000 | Urda et al. .................. 361/704 |

* cited by examiner

Primary Examiner—Alvin Chin-Shue
Assistant Examiner—Sarah Purol
(74) Attorney, Agent, or Firm—Iandiorio & Teska

(57) ABSTRACT

A symmetric wedgelock system includes a compression device having a longitudinal axis; a plurality of segments arranged along the compression device including at least one drive segment at each end and at least one working segment in between each working segment including at least two sections having diverging sides forming a concave wedge facing an associated drive segment; each drive segment having converging sides forming a convex wedge facing an associated working segment; the compression device includes an adjustment device for applying a compressive force along the longitudinal axis to drive the convex wedges of the drive segment into the concave wedges of the working segment to drive apart laterally the sections of the working segment.

10 Claims, 5 Drawing Sheets

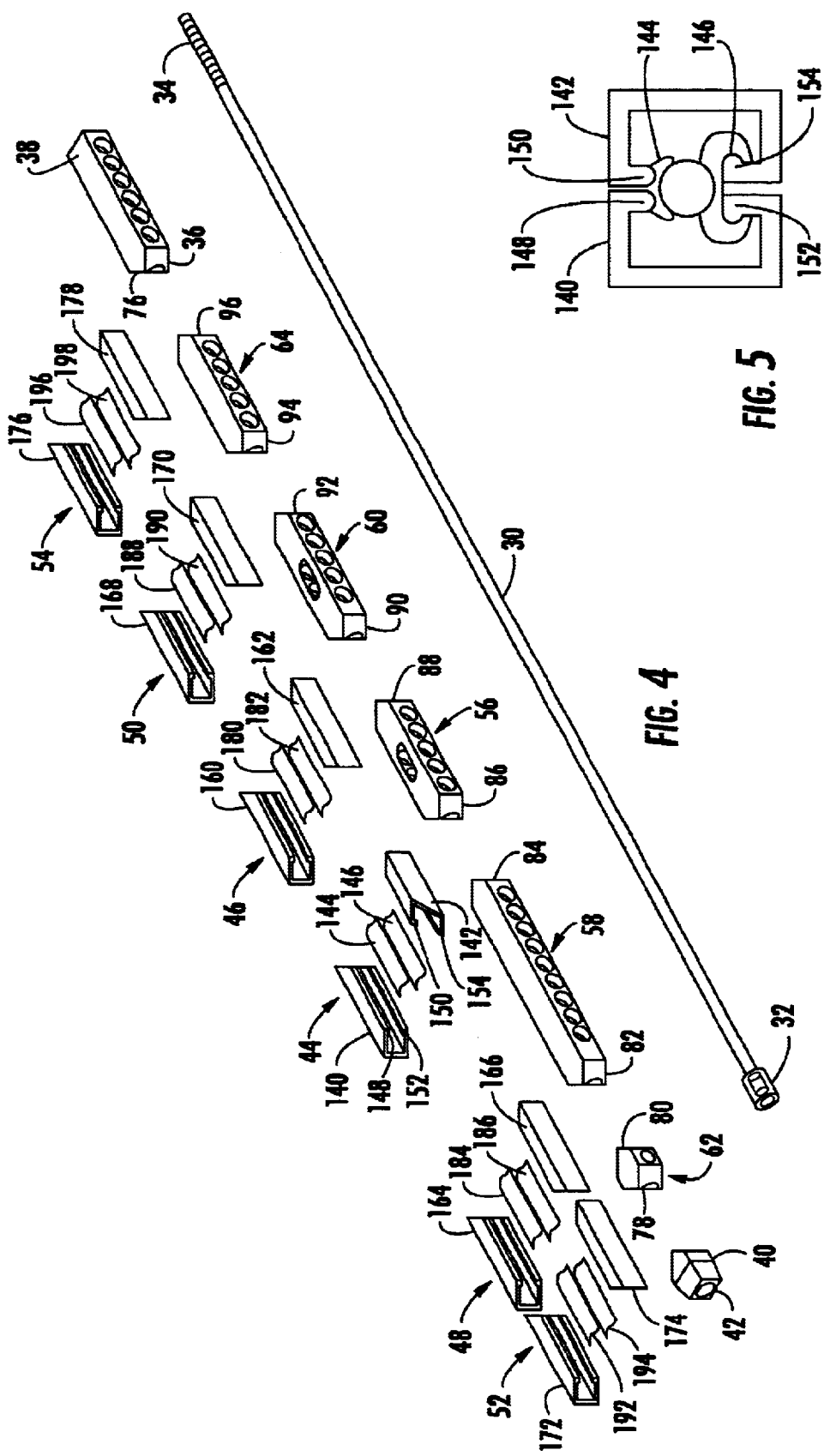

ference and the following figure...

WEDGELOCK SYSTEM

FIELD OF THE INVENTION

This invention relates to a symmetric wedgelock system and more particularly such a system for simultaneously, symmetrically applying the same contact pressure to two separate electronics modules.

BACKGROUND OF THE INVENTION

Existing products do not achieve completely symmetric pressure distribution along the length of the clamping devices when more than two working segments are used to clamp the modules. Symmetric pressure and multiple segments are essential to maintain proper thermal management within the high power dissipation Transmit/Receive Multi-Channel Modules (T/RIMM). These elements contain eight solid state X-band Microwave Modules, packaged onto a cold plate that is clamped and conduction cooled to a liquid cooled manifold. Since stringent electrical performance dictates that thermal gradients between all the T/RIMM's be very small and since other devices onboard the T/RIMM also require thermal management, conventional two working segment wedgelocks are not effective. Conventional electronics clamping devices that employ sliding wedges as a means to apply a pressure 90 degrees (laterally) from the orientation of the actuating screw are prone to jamming when more than two working segments are functionally employed on the device. This is primarily attributed to the mechanics of the device and the friction present within the system. As a result, the outer working segments translate first and expand laterally to achieve contact with the modules before the more central or interior working segments translate and expand. The outer working segments then bind and prevent further clamping pressure to be exerted by the more interior working segments. This interferes with complete and proper contact distribution and can prevent proper retraction as well.

BRIEF SUMMARY OF THE INVENTION

It is therefore an object of this invention to provide an improved wedgelock system.

It is a further object of this invention to provide such an improved wedgelock system which applies contact force more symmetrically and more uniformly.

It is a further object of this invention to provide such an improved wedgelock system which applies contact force more symmetrically and simultaneously to two adjacent electronic modules.

It is a further object of this invention to provide an improved wedgelock system which avoids binding of the segments.

It is a further object of this invention to provide an improved wedgelock system which can utilize an increased number of working segments.

It is a further object of this invention to provide an improved wedgelock system which allows for increased net contact pressure.

It is a further object of this invention to provide an improved wedgelock system which can be tailored to match the requirements of the electronic modules.

The invention results from the realization that a truly effective wedgelock system can be achieved using a compression device to drive convex wedges of wedge segments longitudinally into concave wedges of working segments to drive apart laterally the two parts of the working wedges to apply symmetrically, simultaneously, equal contact pressure in both directions, and from the further realization that by employing springs to interconnect the two parts of the working segments, which springs are stiffest at the end working segments and progressively softer towards the center working segments, a number of working segments can be used to tailor the contact pressure as needed without causing binding of the segments. Alternatively, the concave portions may have increasing divergence angles from the ends to the center to tailor the pressure.

This invention features a symmetric wedgelock system including a compression device having a longitudinal axis and a plurality of segments arranged along the compression device including at least one drive segment at each end and at least one working segment in between. Each working segment includes at least two sections laterally separable and having diverging sides forming a concave wedge facing an associated drive segment. Each drive segment has converging sides forming a convex wedge facing an associated working segment. The compression device includes an adjustment device for applying a compressive force along the longitudinal axis to drive the convex wedges of the drive segments into the concave wedges of the working segments to drive apart laterally the sections of the working segment.

In a preferred embodiment the compression device may be connected to the drive segment at one end and the adjustment device is connected to the compression device at the drive segment at the other end. The compression device may include a lead screw. There may be a number of working segments between end drive segments and at least one intermediate drive segment between each pair of working segments. Each working segment may have a concave wedge at each end. Each intermediate drive segment may have a convex wedge at each end. Each working segment may include a spring interconnecting the sections. The springs in the working segments may vary in stiffness with the softest being in the centrally located working segments and the stiffest in those toward the ends. Alternatively, the wedges may have increasing divergence angles from the ends to the center.

The invention also features a wedge lock system for simultaneously symmetrically applying the same contact pressure distribution to two separate electronic modules including a compression device having a longitudinal axis and a plurality of segments arranged along the compression device including at least one drive segment at each end and at least one working segment in between. Each working segment includes at least two sections laterally separable and having diverging sides forming a concave wedge facing an associated drive segment. Each drive segment has converging sides forming a convex wedge facing an associated working segment. The compression device includes an adjustment device for applying a compressive force along the longitudinal axis to drive the convex wedges of the drive segments into the concave wedges of the working segments to drive apart laterally the sections of the working segment.

BRIEF DESCRIPTION OF THE DRAWINGS

Other objects, features and advantages will occur to those skilled in the art from the following description of a preferred embodiment and the accompanying drawings, in which:

FIG. 4 is an exploded view of the wedgelock system of FIG. 3;

FIG. 5 is a schematic end view showing the assembly of a spring and two sections of a working segment according to this invention.

PREFERRED EMBODIMENT

Beyond the basic structure of this invention it is further understood that merely increasing the quantity of working segments would not work well because the outer working segments would bottom out before the center working wedges to create a non-uniform clamping load and a potential for the device to jam or bind and prevent removal of the T/RIMMs or other electronic modules. An improvement in this invention eliminates these concerns by forcing the center wedges to bottom first thereby allowing the outer wedges to travel further in stroke or translation before bottoming out. This creates a device that has the potential for using many segments, resulting in more uniform load distribution and increased thermal mechanical performance. In one construction, the wedgelock employs springs that capture the sections of the working wedges and constrains them to the lead screw that runs down the middle of the device. The springs function to hold the expanding wedges together with the secondary function to collapse the mechanism when the lead screw is loosened thereby allowing the T/RIMM or other electronic module to be removed. An even further feature of this invention allows for the inclusion of many articulating working segments by tailoring the stiffness of the retaining springs used to hold each of the articulating sections of the working segments by using, in the centrally located working segments, springs that are softer than the springs used in the outer located working segments. This causes the inner working segments to bottom out first as the outer working segments travel longitudinally or translate with little lateral expansion. The inner or center working segments compress the T/RIMM or other electronic module first before the outer working segments expand and take the load. The reverse applies when the lead screw is loosened with the outer working segments collapsing first to prevent the possibility of hang up. The same result can be effected by increasing the steepness of the divergence angle of the working segments from the ends toward the center.

Figure 1:
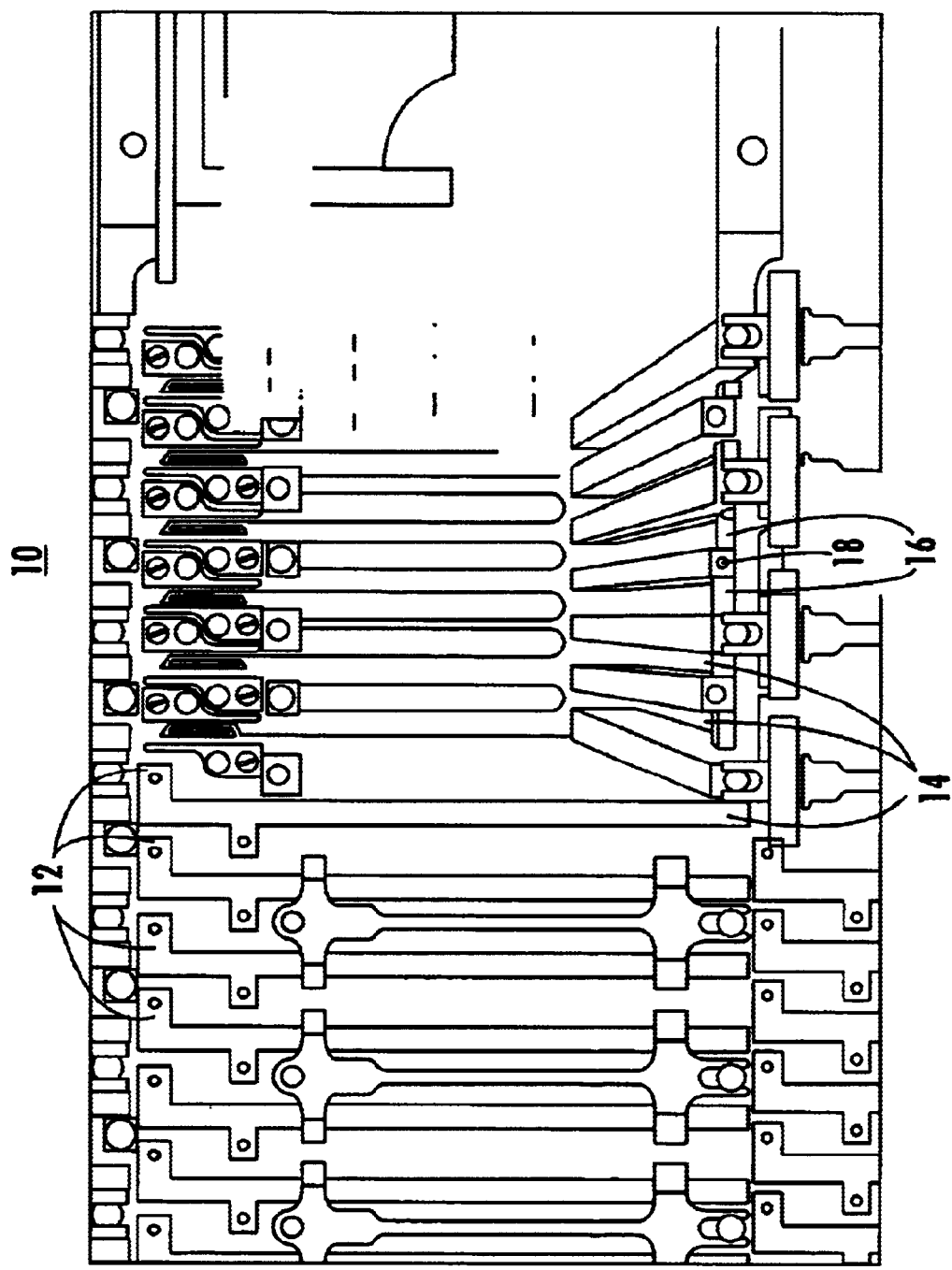
FIG. 1 is a schematic, end, perspective view of a T/RIMM array including a number of T/RIMM electronic module showing the location of wedgelock systems according to this invention.

There is shown in FIG. 1 a T/RIMM array 10 including a plurality of T/RIMM electronic modules 12 located in card guides 14 formed between cooling manifolds 16 and within which is located wedgelock systems 18 according to this invention. Each wedgelock 18 sits between a pair of cooling manifolds 16 to provide two card guides 14 in each of which will be located a T/RIMM electronic module 12.

Figure 2:
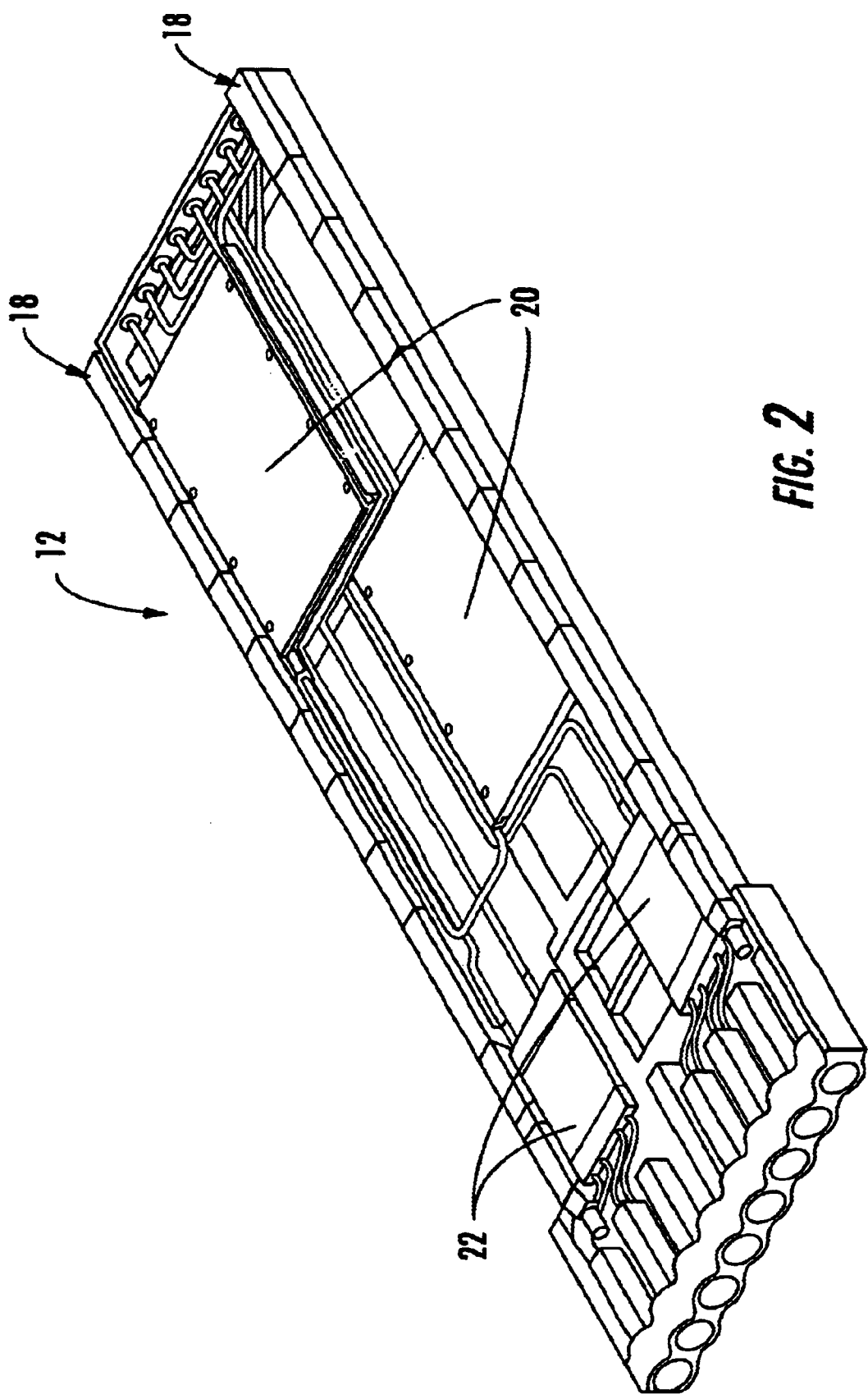
FIG. 2 is a diagrammatic, three-dimensional view of a simple T/RIMM electronic module of FIG. 1.

A single such T/RIMM module 12 is shown in FIG. 2 as including a number of power supplies 20 and T/RIMM modules 22 each of which is cooled by conduction through wedgelock system 18 that securely or firmly thrust against the manifold at the card guides. The wedgelock system according to this invention may act symmetrically, simultaneously on two cards at the same time. Although the wedgelock system of this invention has been shown with particular application to T/RIMM arrays and the securing of T/RIMM modules, this of course is not a necessary limitation of the invention as it may be used in any suitable application, electronic or otherwise.

Figure 3:
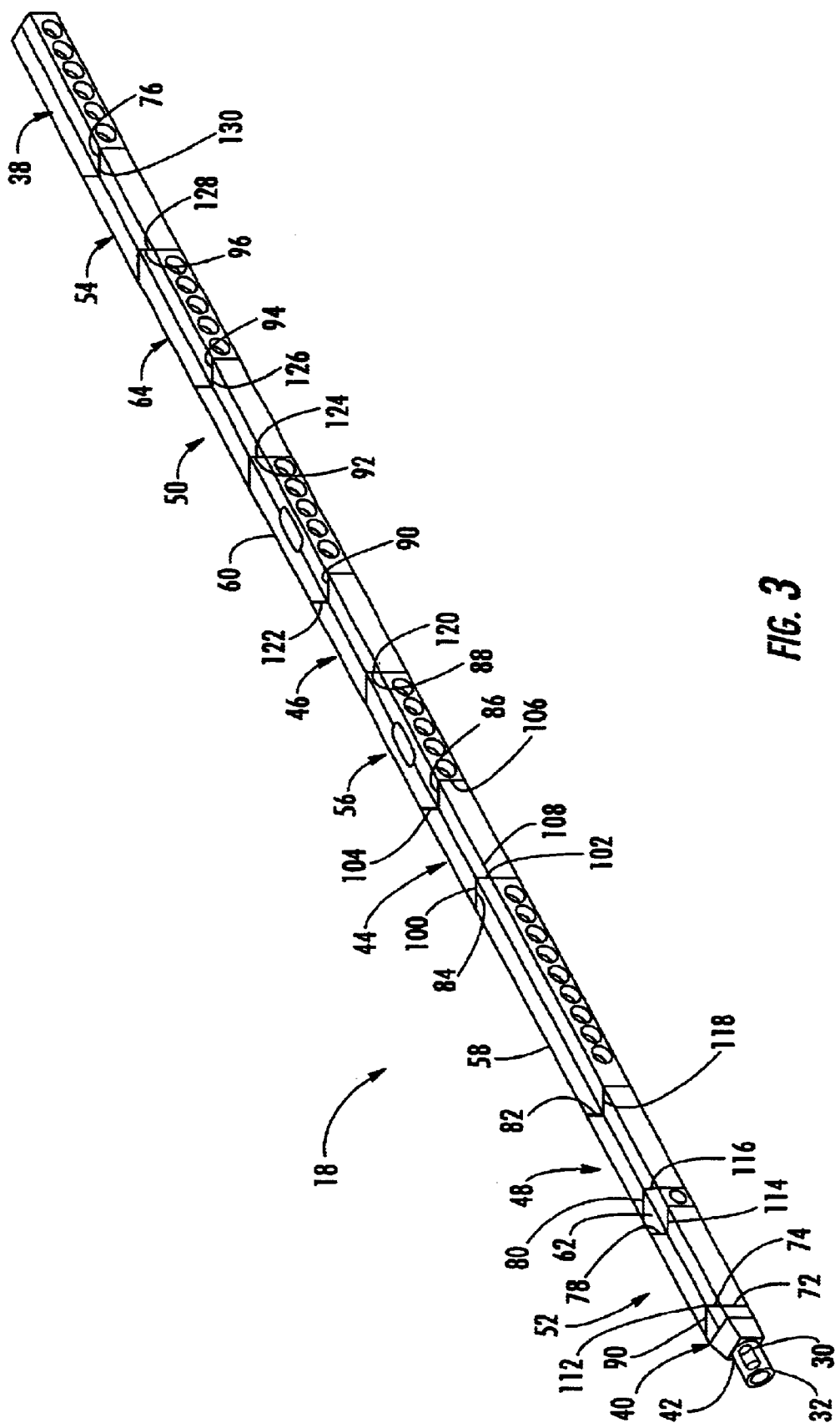
FIG. 3 is a schematic, three-dimensional view of a wedge-lock system according to this invention.

A single wedgelock system 18 according to this invention is shown assembled in FIG. 3 and in an exploded view in FIG. 4. System 18 includes a number of segments arranged along a compression device 30 having an adjustment head 32 at one end. The compression device is typically a lead screw with threads 34 at one end that engage in threads 36 in the end drive segment 38. Another drive segment 40 includes a clearance hole 42 for receiving lead screw 30 as do all the remaining intermediate working segments and drive segments. In this particular embodiment there are six working segments, two inner centrally located working segments 44 and 46, two less centrally located working segments 48 and 50, and two outer working segments 52 and 54. In between them are additional drive segments 56, 58, 60, 62 and 64. Each of the end drive segments exemplified by end segment 40 have converging surfaces 70, 72 which form a convex wedge 74. A similar wedge 76 is formed on end drive segment 38 and each of the intermediate drive segments have such convex wedges on each of their ends associated with a neighboring working segment. For example, wedges 78 and 80 of drive segment 62, wedges 82 and 84 of drive segment 58, wedges 86 and 88 of drive segment 56, wedges 90 and 92 of drive segment 60, and wedges 94 and 96 of drive segment 64.

Each of the working segments 44, 46, 48, 50, 52 and 54, as exemplified by working segment 44, includes two pairs of diverging surfaces 100, 102, 104, and 106, which form concave wedges 108 and 110, respectively, which cooperate with the associated convex wedges 84, and 86 of the neighboring drive segments 58 and 56. Similar concave wedges are formed on the other working segments, for example wedges 112 and 114, working segment 52, wedges 116 and 118, working segment 48, wedges 120 and 122, working segment 46, wedges 124 and 126, working segment 50, and wedges 128 and 130, working segment 54. Although the wedges are shown as sharply angled, this is not a necessary limitation of the invention. For example, the inter-engaging wedges could be in the form of curves, parabolas, or other suitable geometric shapes. The numerous, various holes in the different segments are for access and weight considerations forming no part of this invention.

Each working segment 44, 46, 48, 50, 52 and 54 is made up of two sections as shown with greater detail in FIG. 4, illustratively with respect to working segment 44 which is shown as having two sections 140, 142, joined together by upper and lower springs 144, 146, FIG. 5. Each section 140, 142 has a basically C-shaped channel form wherein the in-turned flanges 148 and 150 engage upper spring 144, and flanges 152 and 154 engage with lower spring 146. The remaining working segments 46, 48, 50, 52 and 54 all include similar flanges on their sections 160, 162, 164, 166, 168, 170, 172, 174, 176 and 178 along with springs 180, 182, 184, 186, 188, 190, 192, 194, 196 and 198, all respectively.

If the outer working segments 52 and 54 expand before the inner working segments 44 and 46, and 48 and 50, they will bottom out against the electronic module such as the T/RIMM before those inner working segments. The first working segment to bottom out will start to resist translation thereby absorbing more of the screw load. In the worst case the outer wedges absorb all the screw load while the inner segments carry none, thus have no clamping force, which means higher contact resistance which results in lower thermal performance, and low thermal performance means low system reliability. The solution, according to this invention, is to control the rate of expansion of the working segments, so that the inner working segments expand before the outer segments, thus the inner working segments bottom out against the electronic module before the outer working segments do. This guarantees proper load distribution and segment retraction. To insure that this feature of the invention is employed the springs are made increasingly stiffer or firmer in the outer working segments and conversely less stiff or softer in the inner working segments. Thus, for example, if in one embodiment where the inner working segments 44 and 46 have springs of 100% stiffness. The next two farther out working segments 48 and 50 have a stiffness of 125% of that and the outermost two working segments 52 and 54 have a stiffness which is 125% of that of the springs associated with working segments 48 and 50. With such a structure using a high strength CRES screw 17-4 PH with a 150 KSI ultimate strength each working segment has applied 700 lbs. of contact force.

Figure 6:
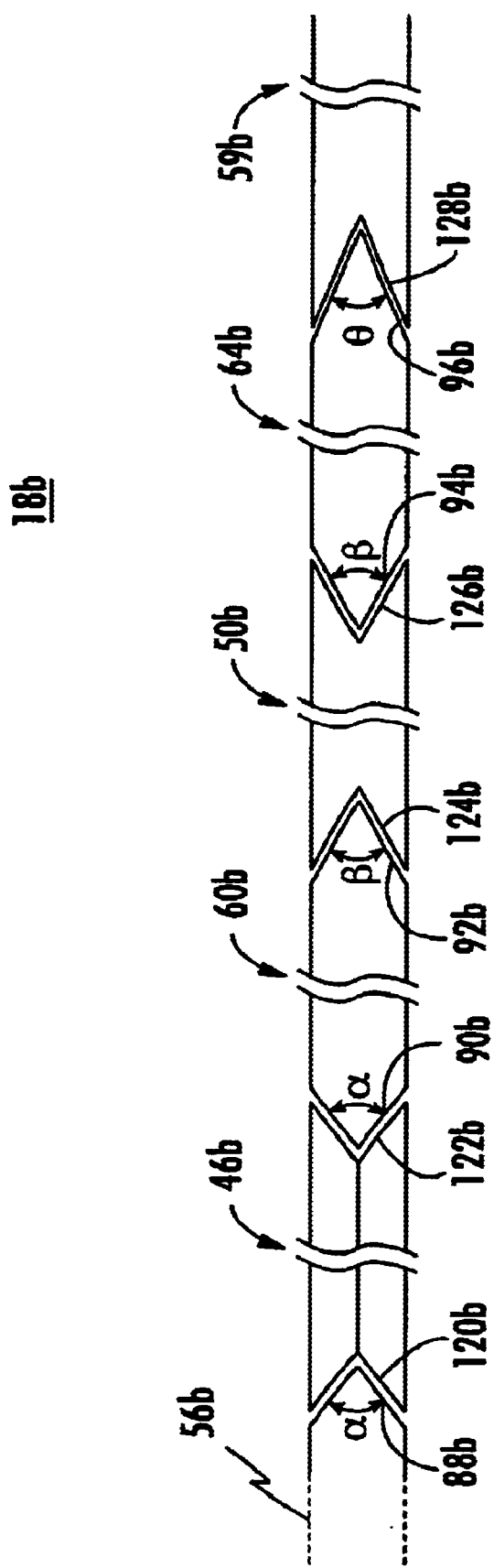
FIG. 6 is a schematic, plan view of an alternative construction of the wedgelock system according to this invention using graduated wedge angles.

Although thus far the working segments have been provided with springs of decreasing stiffness to produce proper load distribution, this is not a necessary limitation of the invention. For example, the convergence/divergence angles of the convex/concave wedges may be made steeper toward the center to effect a more uniform load distribution. As shown in FIG. 6, the concave wedges 120b, 122b of central working wedge 46b may have a divergence angle $\alpha$, the concave wedges 124b, 126b of working wedge 50b may have a divergence angle of $\beta$, and the concave wedges 128b, 130b (not shown) may have a divergence angle of $\theta$, where $\alpha > \beta > \theta$. A mirror image of this graduated angle approach is applied to working wedges 44, 48, 52 and drive wedges 56, 58, 62 and 40.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the

What is claimed is:

1. A symmetric wedgelock system comprising:
    a compression device having a longitudinal axis;
    a plurality of segments arranged along said compression device including at least one drive segment at each end and at least one working segment in between; each working segment including at least two sections and having diverging sides forming a concave wedge facing an associated drive segment; each drive segment having converging sides forming a convex wedge facing an associated working segment;
    said compression device including an adjustment device for applying a compressive force along the longitudinal axis to drive said convex wedges of the drive segments into the concave wedges of the working-segments to drive apart laterally the sections of the working segment.

2. The wedgelock system of claim 1 in which said compression device is connected to the drive segment at one end and the adjustment device is connected to the compressor device at the drive segment at the other end.

3. The wedgelock system of claim 1 in which said compression device is lead screw.

4. The wedgelock system of claim 1 in which there are a number of working segments between end drive segments and at least one intermediate drive segment between each pair of working segments.

5. The wedgelock system of claim 1 in which each working segment has a concave wedge at each end.

6. The wedgelock system of claim 1 in which each intermediate drive segment has a convex wedge at each end.

7. The wedgelock system of claim 1 in which each working segment includes a spring interconnecting the sections.

8. The wedgelock system of claim 7 in which the springs in the working segments vary in stiffness being softest in centrally located working segments and stiffest in those toward the ends.

9. The wedgelock system of claim 1 in which the diverging and converging sides of the associated concave and convex wedges, respectively, have angles of increasing steepness from the ends inwardly.

10. A wedgelock system for simultaneously symmetrically applying the same contact pressure distribution to two separate electronics modules comprising:
    a compression device having a longitudinal axis;
    a plurality of segments arranged along said compression device including at least one drive segment at each end and at least one working segment in between; each working segment including at least two sections and having diverging sides forming a concave wedge facing an associated drive segment; each drive segment having converging sides forming a convex wedge facing an associated working segment;
    said compression device including an adjustment device for applying a compressive force along the longitudinal axis to drive said convex wedges of the drive segments into the concave wedges of the working segments to drive apart laterally the two sections of the working segment.

* * * * *